(12) United States Patent
Engelhardt (10) Patent No.: US 10,825,750 B2
(45) Date of Patent: Nov. 3, 2020

(54) METHOD AND APPARATUS FOR HEAT-DISSIPATION IN ELECTRONICS

(71) Applicant: GE AVIATION SYSTEMS LLC, Grand Rapids, MI (US)

(72) Inventor: Michel Engelhardt, Woodbury, NY (US)

(73) Assignee: GE Aviation Systems LLC, Grand Rapids, MI (US)

(*) Notice: Subject to any disclaimer, the term of this patent is extended or adjusted under 35 U.S.C. 154(b) by 0 days.

(21) Appl. No.: 16/189,251

(22) Filed: Nov. 13, 2018

(65) Prior Publication Data

US 2020/0152541 A1    May 14, 2020

(51) Int. Cl.
  *B32B 3/00*       (2006.01)
  *H01L 23/367*     (2006.01)
  *F28D 15/02*      (2006.01)
  *H05K 7/20*       (2006.01)

(52) U.S. Cl.
  CPC ........ *H01L 23/367* (2013.01); *F28D 15/0233* (2013.01); *H05K 7/20509* (2013.01)

(58) Field of Classification Search
  CPC .............. H01L 23/367; F28D 10/0233; H05K 7/20509
  See application file for complete search history.

(56) References Cited

U.S. PATENT DOCUMENTS

| 4,414,604 | A  | 11/1983 | Matsui et al. |
| 5,770,295 | A  | 6/1998  | Alderman |
| 8,913,389 | B2 | 12/2014 | Fukui et al. |
| 10,028,408 | B2 | 7/2018 | Engelhardt et al. |
| 2004/0141539 | A1* | 7/2004 | Delgado, Jr. ......... F28D 20/023 372/89 |
| 2012/0300406 | A1 | 11/2012 | Fukui et al. |
| 2014/0131023 | A1 | 5/2014 | Raman et al. |
| 2016/0109195 | A1 | 4/2016 | Engelhardt et al. |
| 2017/0254323 | A1 | 9/2017 | Engelhardt et al. |
| 2017/0311478 | A1 | 10/2017 | Engelhardt et al. |

FOREIGN PATENT DOCUMENTS

| DE | 102010034901 A1 | 8/2010 |
| EP | 2533281 A1 | 12/2012 |
| WO | 2019068773 A1 | 4/2019 |

OTHER PUBLICATIONS

European Patent Office, European Search Report re Corresponding Patent Application No. 19208114.9—1203, Apr. 14, 2020, 7 pages, Munich, Germany.

* cited by examiner

*Primary Examiner* — Elizabeth E Mulvaney
(74) *Attorney, Agent, or Firm* — McGarry Bair PC (57) ABSTRACT

A method and apparatus for heat-dissipation a structure having a first and second surface. The first surface defines a heat absorbing surface having a plurality of cavities and a heat absorbing coating applied to the first surface and within the cavities. Additionally, a set of etchings can be provided on the first surface to increase absorption. The cavities can be pyramidal, hexagonal, or conical shapes, for example.

19 Claims, 7 Drawing Sheets

METHOD AND APPARATUS FOR HEAT-DISSIPATION IN ELECTRONICS

BACKGROUND OF THE INVENTION

Contemporary aircrafts use avionics and electrical power conversion systems to control and power the various equipment and operations for flying the aircraft, among other electronic components. The avionics can include electronic components mounted on a printed circuit board, bus bars, capacitors, transformers, electromagnetic interference filters, as well as other electronic subcomponents and subsystems integrated into an electronic chassis. The electronics, such as avionics or the circuit boards can be stored in an avionics chassis, which performs several beneficial functions, some of which are: electrical power conversion electrically shielding the avionics from electromagnetic interference (EMI), protecting the avionics from lightning strikes, environmental exposure, or otherwise. Additional electronic components are often tightly-grouped to save space. Effectively dissipating the heat generated by the avionics or electronic components is important to maintaining the avionics or electronic components within the manufacturer's rated temperatures to achieve the desired reliability, particularly within the avionics chassis or other tightly grouped components.

BRIEF DESCRIPTION OF THE INVENTION

In one aspect, the disclosure relates to a radiant heat absorber including a structure having a first and second opposing surface, with the first surface defining a heat absorbing surface having a plurality of cavities and a heat absorbing coating applied to the first surface and residing within the cavities.

In another aspect, the present disclosure relates to a radiant heat absorber including a structure having a first surface configured to face a heat-producing element and defining a heat absorbing surface, and a second surface opposite the first surface; wherein the first surface defines a plurality of cavities including one of a pyramidal shape, a hexagonal shape, or a conical shape and the second surface defines a plurality of protrusions complementary to the plurality of cavities.

In yet another aspect, the present disclosure relates to a method of dissipating heat from a heat generating element, the method including absorbing heat generated by the heat generating element with a radiant heat absorber including a first surface with a plurality of cavities having one of a pyramidal shape, a hexagonal shape, or a conical shape; and dissipating the heat absorbed by the radiant heat absorber at a second surface, opposite of the first surface, with a plurality of protrusions having the same one of the pyramidal shape, the hexagonal shape, or the conical shape of the plurality of cavities; wherein the dissipating includes convective heat transfer from the second surface.

DETAILED DESCRIPTION OF THE INVENTION

Aspects of the disclosure describe an approach to improved function of cooling by improving radiant heat transfer from a heat-generating element, such as electrical component, with a radiant heat absorber. Avionics, electronics, or other components, such as those in an aircraft, are often convectively cooled by passing a fluid such as air across the avionics, electronics, or components, or transferring the heat therefrom and convectively removing the transferred heat. When such avionics, electronics, or other components are cooled by convection with a flow of air, the cooling capabilities are limited by the volume of air, the density of the air, as well as the local capacity to pass the volume of air. When a manned aircraft is flying at altitude, or an unmanned aircraft flies at altitude, which can fly at significantly higher altitudes than that of manned craft, the air density is significantly decreased, which decreases convection cooling effectiveness. At some altitudes, the air density can be 10% that of sea level. Avionics including electrical components and other components are constantly challenged with dissipating the heat produced within the increasing thermal production within the aircraft environment. Convective cooling utilizing external air can be challenging, particularly in environments where the local air density is decreased. The extended range of temperature operation and the ever-increasing power density of state of the art designs results in the thermal design of heat dissipation becoming one of the main limiting factors in the performance of the system or aircraft.

While the description for the radiant heat absorber will generally pertain to an avionics chassis within an aircraft, it should be appreciated that the radiant heat absorber can be disposed on a plurality of elements, such as any electronics chassis, electronic components, motors such as those integrated in an aircraft, or any other heat-generating component, for example. Further still, the radiant heat absorber can be useful in environments having high power dissipations with poor cooling environments, such as those often involved with compact avionics and power generation. The radiant heat absorber will also have applicability in other environments where heat dissipation is required or convection is challenging, such as non-aircraft, terrestrial, or other environments, as well as any other environment where heat dissipation is desirable, and should not be limited to aircraft or avionics implementations.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

Figure 1:
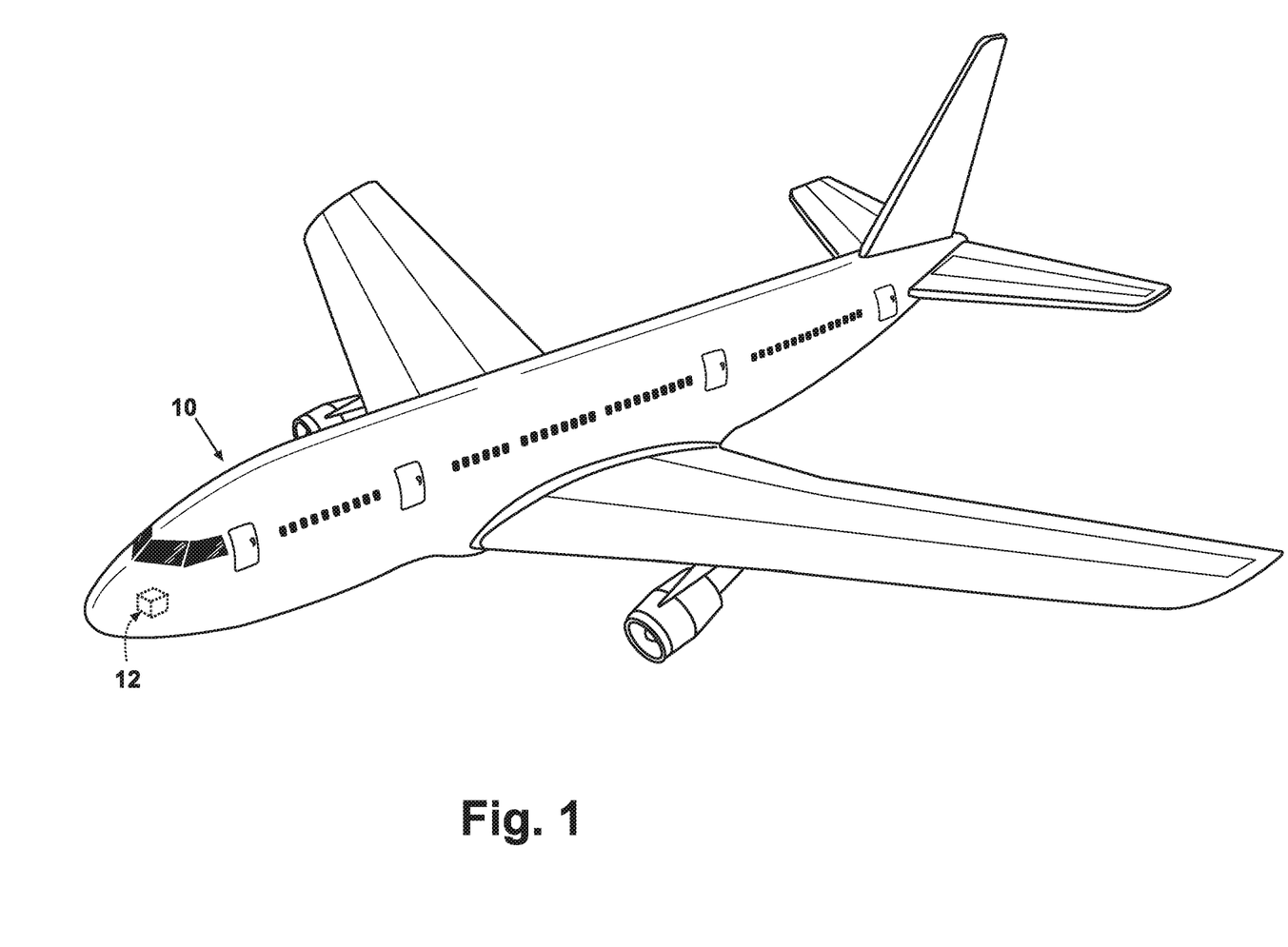
FIG. 1 is a perspective view of an aircraft having an avionics chassis with electrical components in accordance with various aspects described herein.

FIG. 1 schematically illustrates an aircraft 10 with an on-board avionics chassis 12 (shown in broken-line) for housing avionics, electronics, electrical components, or avionics components for use in the operation of the aircraft 10. The avionics chassis 12 houses a variety of avionics elements and protects them against contaminants, electromagnetic interference (EMI), radio frequency interference (RFI), vibrations, shock, humidity, temperature, and the like. While illustrated in a commercial airliner, the avionics chassis 12 can be used in any type of aircraft, for example, without limitation, fixed-wing, rotating-wing, rocket, commercial aircraft, personal aircraft, and military aircraft, as well as any vehicle requiring similar protection. The avionics chassis 12 can be located anywhere within the aircraft 10, not just the nose as illustrated. Furthermore, aspects of the disclosure are not limited only to aircraft aspects and can be included in other mobile and stationary configurations. Non-limiting example mobile configurations can include ground-based, water-based, or additional air-based vehicles. Further yet, aspects of the disclosure are not limited to that of an avionics chassis, but any portion of the aircraft where heat dissipation or heat transfer would be beneficial, as well as any environment where heat dissipation would be desirable.

Figure 2:
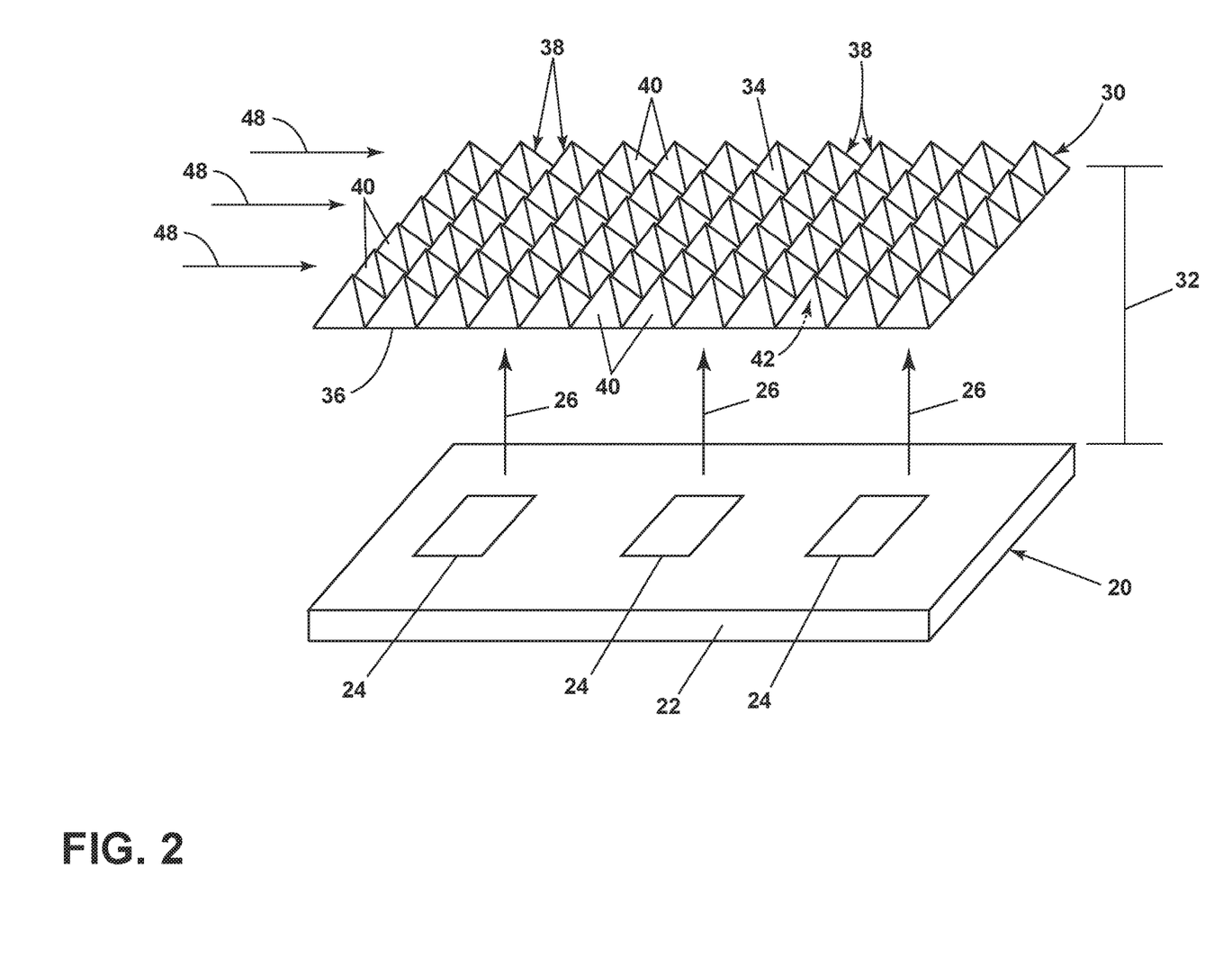
FIG. 2 is a schematic perspective view of one electrical component of FIG. 1 spaced from a radiant heat absorber having a four-sided pyramidal geometry.

Referring now to FIG. 2, an electrical component 20 is shown as a printed circuit board (PCB) 22 having a set of electronics 24. It should be understood that the PCB 22 is used as an example and that any other heat dissipating element. During operation, the electrical component 20 generates a volume of heat 26, which is emitted from the electrical component 20. A radiant heat absorber 30 is provided adjacent and spaced from the electrical component 20 by a space 32 or gap. In one example, the radiant heat absorber 30 can form the walls or cover of the avionics chassis 12 of FIG. 1. The radiant heat absorber 30 as illustrated includes a generally sheet-like geometry, with an upper surface 34 and a lower surface 36, and including a plurality of discrete elements 38 shown as four-sided, pyramidal-shaped protrusions 40 defined in the upper surface 34, defining a plurality of complementary cavities 42 in the lower surface 36, having a shape complementary to that of the four-sided, pyramidal-shaped protrusions 40 on the upper surface 34. The cavities can be miniature cavities, such as on the order of 0.5 centimeters, whose geometry is optimized to efficiently absorb radiant heat, which is described in detail herein. While shown as a sheet, it should be appreciated that the radiant heat absorber 30 can be formed as a discrete element, positioned local to a heat emitting element. Furthermore, the radiant heat absorber can be curved or arcuate, and need not be planar, the curvature of which can be limited by the shape and size of the protrusions 40 defined on the upper surface 34. In this way, the radiant heat absorber can be adapted to at least partially conform to the shape of the electrical component 20. The cavities 42 can have a volume ranging between 0.25 cubic inches (0.635 cubic centimeters) to 1.0 cubic inches (2.54 cubic cm) and can have a surface area ranging between 0.15 square inches (0.381 square cm) and 0.5 square inches (1.27 square cm), for example, while smaller or greater volumes and surfaces areas are contemplated. The radiant heat absorber can be configured to absorb heat in a first temperature range, such as 50-degree Celsius to 100-degree C., while greater or lesser ranges or temperatures are contemplated. The particular materials utilized can be used to limit the temperature ranges. Additionally, the radiant heat absorber 30 can be tailored to a thermal conductivity, such as greater than 200 Watt/meter-Kelvin, in one non-limiting example.

When the radiant heat absorber 30 is installed, it can be arranged such that the lower surface 36, or the surface having the plurality of cavities 42, faces the heat emitting electrical component 20. The upper surface 34 can be opposite of the lower surface 36, arranged to contact a convective fluid 48, for example, such as air or liquid. The upper surface 34 can also be considered to radiate heat to a cooler surface that is integrated as part of an enclosure on the aircraft, for example. Alternatively, other methods or heat exchanges can be utilized to transfer the heat from the upper surface 34, such as fluids, heat pipes, paraffin, thermal electric coolers, or graphite straps in non-limiting examples.

Figure 3:
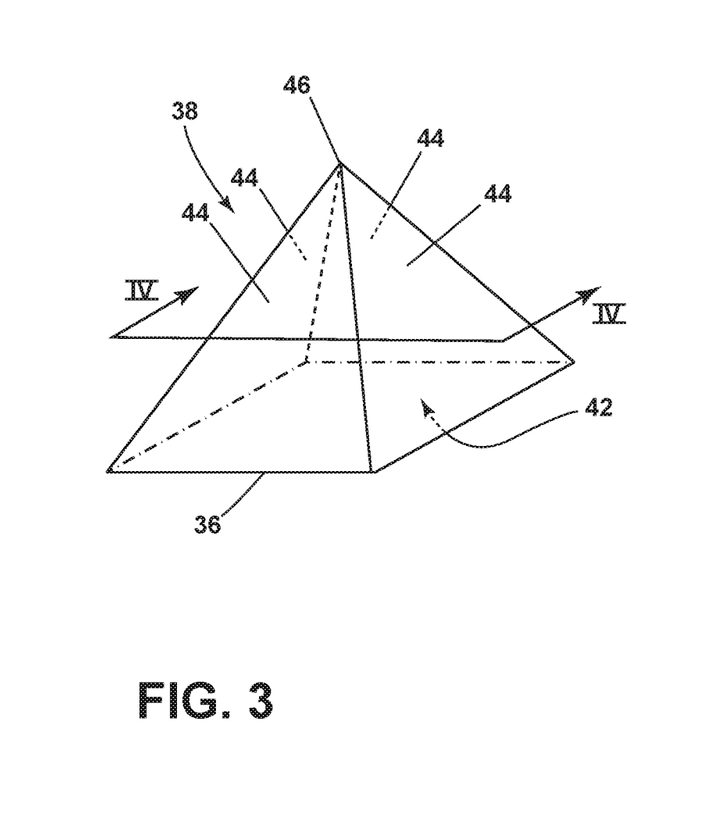
FIG. 3 is a perspective view of one four-sided, pyramidal element of the radiant heat absorber of FIG. 2.
Figures 8, 9, 10:
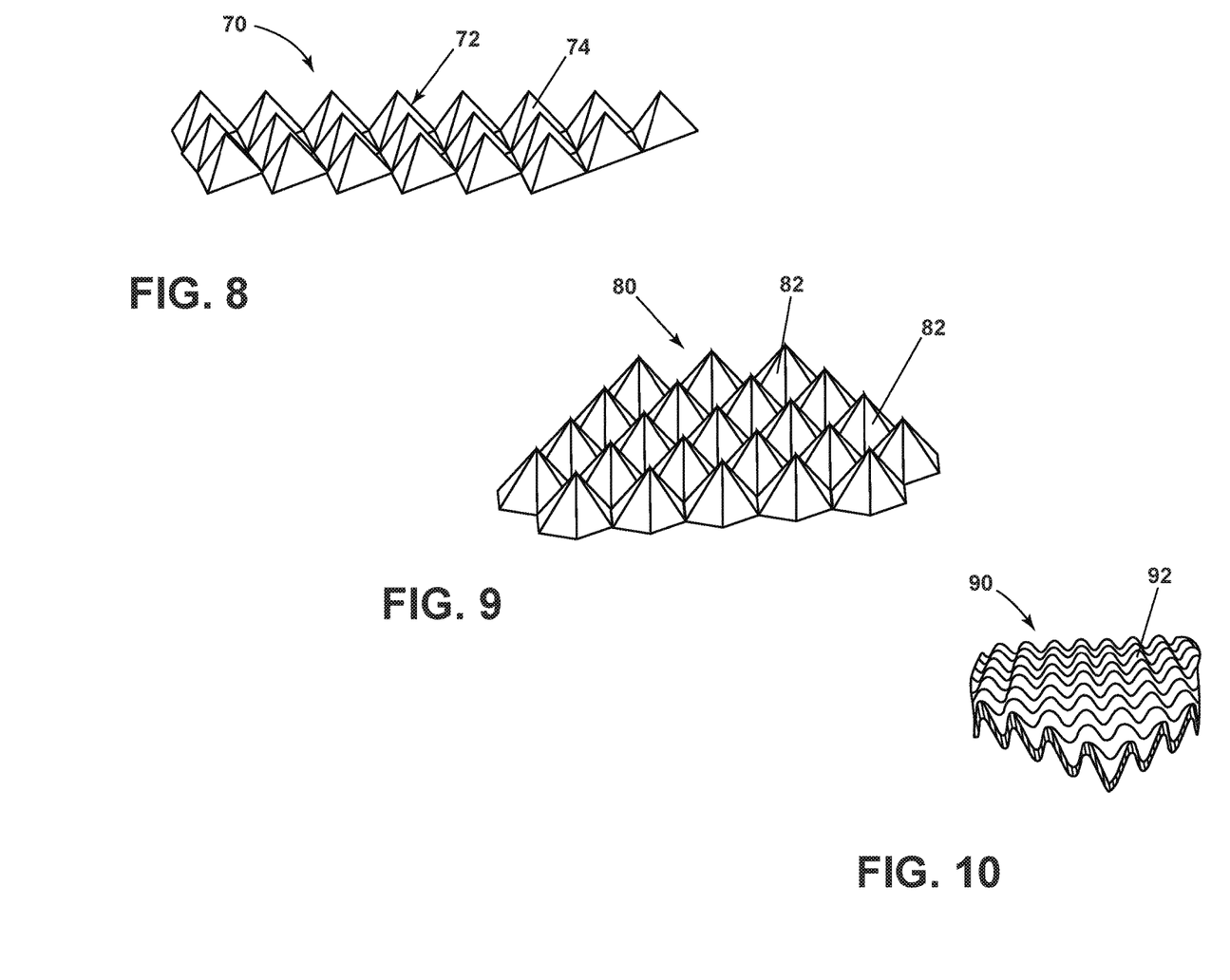
FIG. 8 is a perspective view of a portion of another radiant heat absorber having a plurality of three-sided, pyramidal elements.
FIG. 9 is a perspective view of a portion of yet another radiant heat absorber having a plurality of six-sided, pyramidal elements.
FIG. 10 is a perspective view of another portion of yet another radiant heat absorber having a plurality of conical-shaped elements.

Referring briefly to FIG. 3, one discrete element 38 of the radiant heat absorber 30 can include the four-sided, pyramidal shape, having four planar sides 44 terminating at a tip 46, while additional geometries are contemplated. In one example, a truncated tip 46 is contemplated, while further exemplary geometries are also depicted in FIGS. 8-10. The cavity 42 provides for a greater surface area as compared to a flat, planar surface, for absorbing a greater amount of heat as well as providing for reflecting or refracting the heat back toward itself when not absorbed, as opposed to back toward the electrical component, increasing overall absorption.

Figure 4:
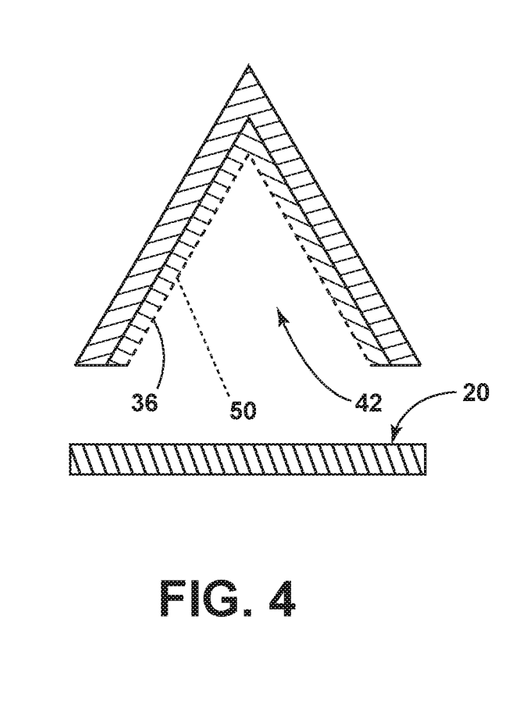
FIG. 4 is a cross section view of the four-sided pyramidal element of FIG. 3.

Referring now to FIG. 4, taken across section IV-IV of FIG. 3 and better showing the cavity 42 of the radiant heat absorber 30, the lower surface 36 can include a coating 50. The coating 50 can be a heat absorbing or high-absorption coating, such as a multi-layer, metallic oxide, laser black coating used to absorb the radiated heat, often referred to as a laser black coating. A laser black coating can withstand temperatures up to 100 Celsius without degradation, providing resilience for the radiant heat absorber 30. Where the radiant heat absorber is aluminum, a nickel plating can coat the radiant heat absorber 30, and the laser black coating can be applied to the nickel plating. The laser black coating can be a micro-dendritic structure velvet-like inorganic coating that will not gas out at altitude. As such, it should be appreciated that a plurality of coatings or surface treatments can be applied to the lower surface 36 to improve absorption at the lower surface 36. Such a coating can provide for even greater heat absorption, as opposed to that without a coating.

Alternatively, the coating 50 can be made of a spectral coating or paint that is tunable to the Planckian thermal emission from the electrical component 20. For example, the coating 50 can be tuned to absorb the heat emission from the electrical component at maximum rate based upon the emission or expected emission of the particular electrical component 20. Such a tuning of the coating 50 can be achieved by the chemical composition of the coating, for example. More specifically, Planck's law is a function of temperature, index of refraction, and wavelength, as well as the emissivity based upon the grey body intensity. Therefore, the spectral coating or paint can be specifically tuned to the electrical component wavelength in order to minimize overall radiosity, such as within the mid-infrared wavelength region (being less than 8 micrometers), for example, while maximizing absorption based upon the expected emission wavelength. More particularly, the coating can be tailored to have low emissivity in the thermal wavelength region and high absorptivity in the high temperature emission band of the particular electrical component. In one particular example, a semiconductor-based radiant heat absorber can include a coating 50 tailored to exploit a sharp drop in long wavelength absorption at the bandgap energy to achieve absorption greater than 85% at high temperature emission wavelengths and an emittance of less than 5% at low temperature thermal wavelengths.

In operation, generally, the radiant heat 26 is emitted by the electrical component 20 and absorbed by the radiant heat absorber 30 at the lower surface 36. The heat is transferred to the upper surface 34 where it can be removed via heat exchange. The cavities 42 provide for increased surface area for absorbing radiant heat as well as deflect any emitted radiation back toward itself utilizing the pyramidal geometry, while an additional coating can further improve overall absorption. As such, the radiant heat absorber 30 provides for greater overall absorption as compared to a flat absorber, and provides for improved absorption in areas where reduced air density makes convective cooling challenging.

Figure 5:
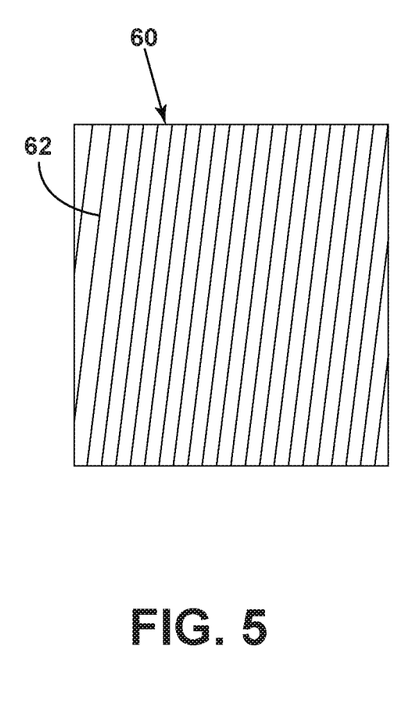
FIG. 5 is a view of an etched surface for a radiant heat absorber having linear etchings.
Figure 6:
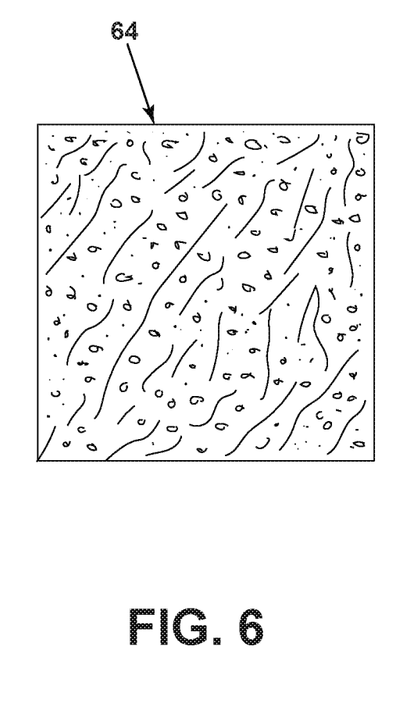
FIG. 6 is a view of another etched surface for a radiant heat absorber having a rough etched surface.
Figure 7:
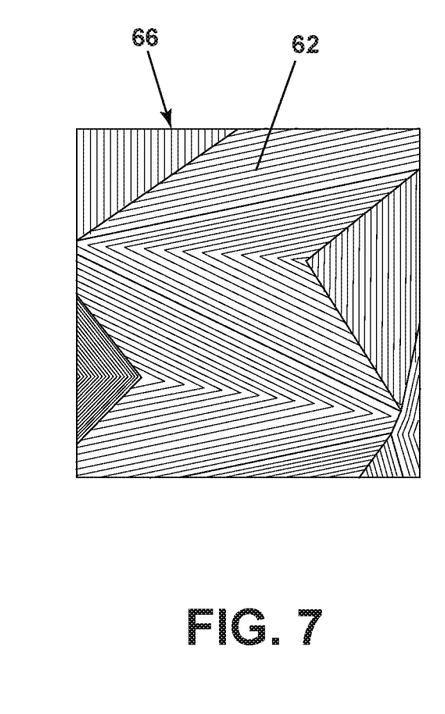
FIG. 7 is a view of yet another etched surface for a radiant heat absorber having a triangular-patterned etched surface

Additionally, the lower surface 36 can be etched. Referring now to FIG. 5, a first etching pattern 60 is shown, having a set of linear etchings 62 arranged in a parallel manner. While shown as linear etchings 62, it is contemplated that the etchings can be non-linear, discrete, curved, arcuate, curvilinear, step-wise, variable, unique, geometric, or otherwise, or any combination thereof, and need not be arranged in a pattern such as the parallel manner. Referring now to FIG. 6, an example of a unique, rough etching pattern 64 is shown, having a set of random, rough etchings forming the unique or varying etching pattern 64. Referring to FIG. 7, an example of a geometric etching 66 is shown, having a set of linear etchings 62 arranged in an alternating triangular pattern to form the geometric etching 66. In this way, a combination of linear etchings 62 can be organized in a manner that forms the pattern or geometric etching.

The etchings provided on the lower surface 36 increases the absorptivity and the root mean square area of the lower surface 36, and can provide for additional bouncing or reflecting of radiant energy within the rough surface, which raises overall absorption of the radiant heat absorber 30. As at least some of the heat will reflect or bounce off the lower surface 36, the etchings provide for a rough surface, which can direct bounced or reflected heat back toward the lower surface 36 providing additional opportunity for absorption of the heat. As the reflected or bounced heat will be perpendicular to the radiant vector, a surface etching can provide for directing the reflected heat back toward the lower surface 36 providing for greater opportunity for absorption and greater overall absorption. The etchings can be utilized in combination with the coating 50 as discussed in FIG. 4, such that the coating 50 can be provided on or over the etchings. In one example, the etchings can be made by integrating micro-etchings into a stamping machine, stamping the radiant heat absorber 30, and the coating 50 can be applied onto the etched surface, while other suitable methods of forming the etchings are contemplated.

While FIGS. 2-7 are described in relation to the radiant heat absorber 30 including discrete elements 38 having four-sided, pyramidal shapes, it should be appreciated that other geometries are possible. More specifically, suitable geometries are those that form a set of cavities on the bottom surface facing the heat source, while forming complementary protrusions on the top surface for removing the collected heat. Referring now to FIG. 8, one exemplary alternative geometry can include a radiant heat absorber 70 including a pattern of discrete elements 72 having a three-sided pyramidal geometry. Similar to that of FIGS. 2-7, the discrete elements 72 can include a protruding upper surface 74 and a complementary plurality of cavities (not shown) formed into a lower surface respective of the protruding three-sided upper surface. Such cavities will have a similar, but inverted, three-sided pyramidal geometry.

Referring now to FIG. 9, another exemplary geometry for a radiant heat absorber 80 can include a pattern of hexagonal-shaped discrete elements 82. The hexagonal elements 82 are six-sided to pattern together to form the radiant heat absorber 80. Each element includes a protruding side and a complementary hexagonal-shaped cavity side, similar to that as described herein.

Referring now to FIG. 10, another exemplary geometry for a radiant heat absorber 90 can include a conical pattern of conical or arcuate discrete elements 92. Each element is rounded, similar to that of an egg-carton shape, having a plurality of protrusions in a first surface and a plurality of complementary cavities formed in the opposite second side.

Additionally, while FIGS. 2 and 8-10 are shown as planar groupings of the discrete heat exchanger elements, the arrangements need not be planar and can be any suitable shape to absorb heat from a component. In one specific example, the radiant heat absorber can be a cylinder around a component, or even a sphere encasing the component to improve total overall absorption. Furthermore, additional three-dimensional shapes for the cavities and the protrusions are contemplated such as, but not limited to, a hexagonal shape, a conical shape, a squared shape, a rectangular shape, a spherical shape, an ellipsoidal shape, a unique shape, a truncated shape, a geometrical shape, a rectilinear shape, a curvilinear shape, or any suitable combination thereof that defines a cavity. Preferable shapes are those that tend to reflect non-absorbed heat emissions back toward itself. Additionally, it is further contemplated that the upper side and opposing lower side need not be the same or complementary shapes and can be different, such as the upper surface formed as a pyramidal shape or having a plurality of fins, with the lower surface having a hexagonal shape in one non-limiting example.

Figure 11:
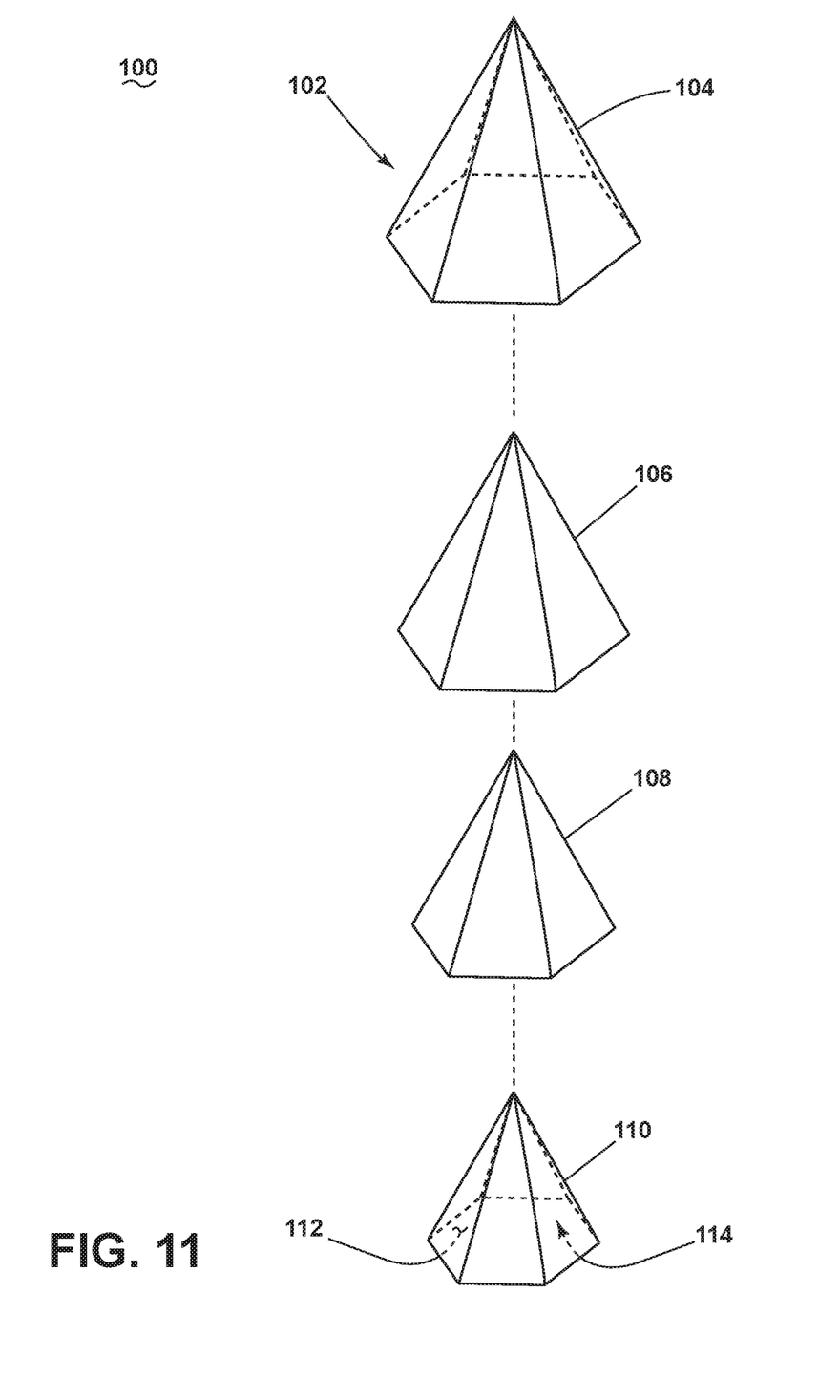
FIG. 11 is an exploded view of a single element of a radiant heat absorber having a phase-change material and a compressible material between an inner structure and an outer structure.

Referring now to FIG. 11, a portion of another radiant heat absorber 100 is shown as a discrete element 102 in exploded form. While shown as a single element 102, it should be understood that the radiant heat absorber 100 can be a sheet of combined discrete elements 102, similar to that shown in FIG. 9, and is only shown as a single discrete element 102 for ease of understanding. The radiant heat absorber 100 includes an upper structure 104, a compressible thermal pad 106, a phase change material 108, and a lower structure 110.

The compressible thermal pad 106 can be made of a material having a high thermal conductivity that is readily compressible based upon expansion of the phase change material 108 between the upper structure 104 and the lower structure 110. The phase change material 108 can be paraffin, for example, while any suitable phase change material is contemplated. Paraffin can have about 10% volume expansion during phase change, so the compressible thermal pad 106 can be sized to account for such a volume increase. In one example, the paraffin can be doped, such as with carbon, to selectively control the temperature at which the phase change material 108 changes phase from solid to liquid or gas, such as between 40-100 degrees Celsius (C) in one non-limiting example. Other phase change materials can be considered with the ability to change phase from solid to liquid or from liquid to vapor depending on its phase change temperature.

An interior surface 112 of the lower structure 110 defines a cavity 114. The interior surface 112 can be coated with an absorptive material or coating, such as the laser black coating described herein, and can also be etched to increase the absorption of the lower structure 110.

Manufacture of the radiant heat absorber 100 can include forming of the lower structure 110 and covering the lower structure 110 with the phase change material 108, until it solidifies. The compressible thermal pad 106 can be attached to the inner side of the upper structure 104, and the two can be combined, with the compressible thermal pad 106 abutting the phase change material 108. The radiant heat absorber 100 can be sealed as well as gasketed around its contact periphery to prevent leaking of the phase change material.

Figure 12:
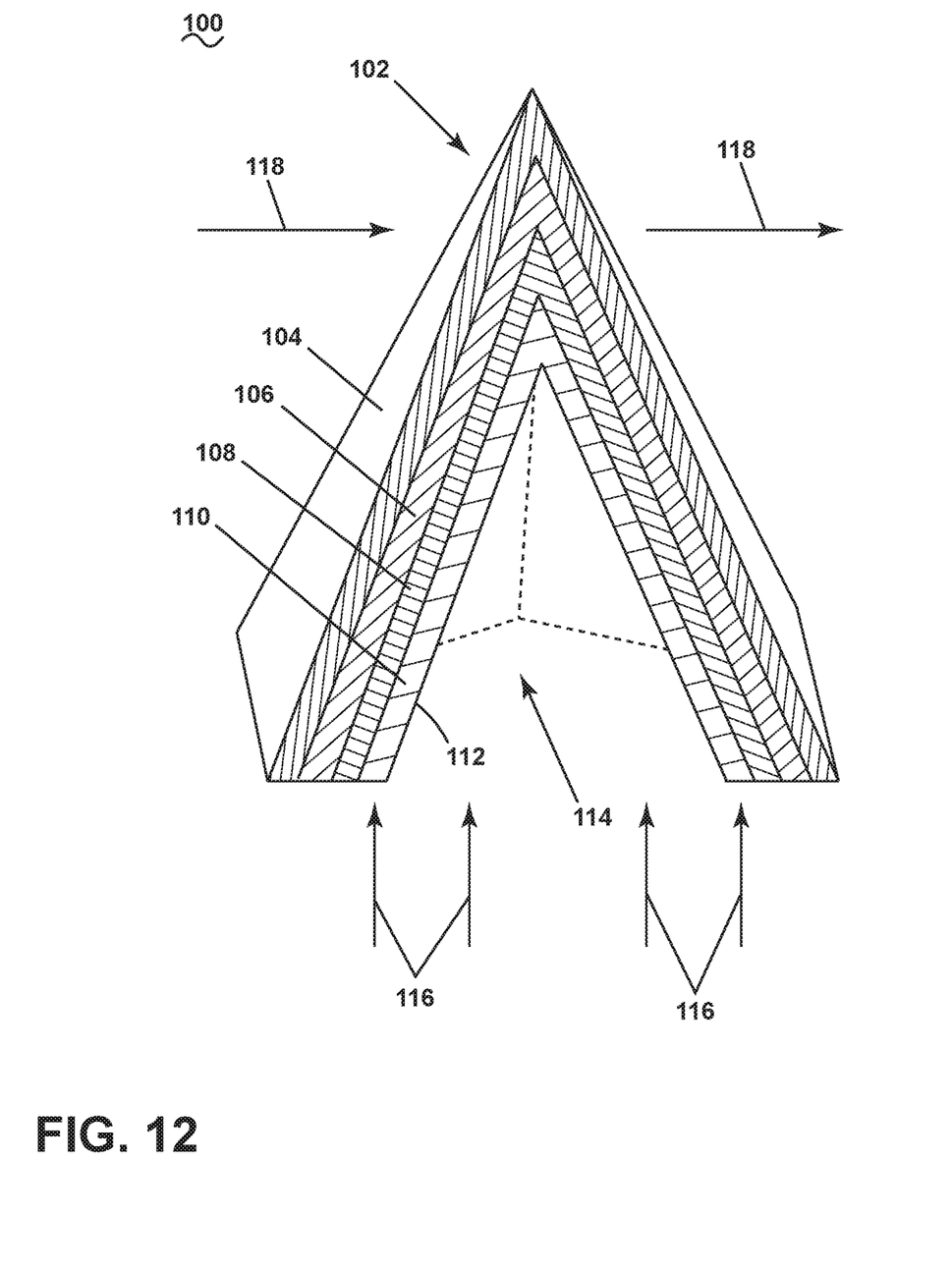
FIG. 12 is a cross section view of the assembled radiant heat absorber element of FIG. 11.

Referring now to FIG. 12, showing the assembled radiant heat absorber 100 of FIG. 11, the discrete element 102 is formed in a stacked relationship, with a stacked order from top to bottom of: the upper structure 104, the compressible thermal pad 106, the phase change material 108, and the lower structure 110. As heat 116 or thermal emissions contact the lower structure 110, the heat is absorbed. The laser black coating or etching on the interior surface 112 can provide for improved absorption of the heat 116 contacting the lower structure 110. As the heat is absorbed by the lower structure 110, it is transferred to the phase change material 108, heating the phase change material 108. As the phase change material 108 heats, it changes phase, such as from a solid to a liquid, and expands. As the phase change material 108 expands, the compressible thermal pad 106 can compress or contract to provide space for the expansion of the phase change material 108, while simultaneously transferring heat from the phase change material 108 to the upper structure 104. The heat can then be removed from the upper structure 104 by means of heat exchange, such as with convective heat transfer utilizing a flow of air 118 or liquid across the upper structure 104.

A method of dissipating heat from a heat generating element can include absorbing heat generated by the heat generating element, such as the electrical component 20 of FIG. 2, with the radiation heat absorber 30, 70, 80, 100 including the first lower surface 36 with a plurality of cavities 42; and dissipating the heat absorbed by the radiant heat absorber 30, 70, 80, 100 at a second upper surface 34, opposite of the first surface 36, with a plurality of protrusions 40. The cavities 42 and the protrusions 40 can have one of a pyramidal shape, a hexagonal shape, or a conical shape, while other geometrical shapes are included such as squared, rectangular, spherical, ellipsoidal, unique, truncated, geometrical, rectilinear, curvilinear, or any suitable combination thereof. The method can further include treating the first surface with one of a heat absorbing coating or a set of etches or micro-etches, where micro-etches are formed in the magnitude of micrometers. The heat absorbing coating can be a laser black coating or a tunable spectral coating or paint, for example.

Additionally, the present disclosure can include a method of dissipating heat from a heat generating element in a transient manner. The transient manner of heat dissipation from the element can be a repetitive pulse, such as a square or sinusoidal waveform, an arbitrary transient form factor, or a transient manifested by diurnal operation that affects the thermal behavior of the electronic element. To more efficiently absorb the transient heat dissipation, a triangular shape, a pyramidal shape, a hexagonal shape, or a conical shape, as well as any other shape that constitutes or necessarily forms a cavity is configured with another such structure that sandwiches a phase change material between the two structures.

The radiant heat absorbers as described herein provide for improved radiation heat transfer to reduce power, weight, volume, and cost when integrated as a cooling means, which can provide for improved specific fuel consumption in aircraft implementations. Additionally, the radiant heat absorber can provide for heat dissipation while requiring no electrical power. Specifically, for aircraft implementations, high-altitude operation provides for convective cooling with reduced-density external air, which provides for degraded heat dissipation. The radiant heat absorber as described herein can provide for improved heat absorption, transfer, and dissipation, greater than that of convective cooling at high altitudes resultant of the reduce-density air. Specifically, heat dissipation of unmanned aircraft at 60,000 ft can be significantly improved over convective cooling, as air density at such an altitude can be about 10% that of sea level. Air density is proportional to convective heat transfer coefficient and proportion to the Nusselt's number, diminishing convective heat transfer as altitude increases. The radiant heat absorber as described herein does not suffer from such deficiency. More specifically, the radiant heat absorber as described herein can provide for twice the convective dissipation capability of a fan at 60,000 ft altitude, or more.

Additionally, the radiant heat absorber as described herein can be further described as a 'radiation sponge' as it is specifically and geometrically designed to absorb radiant heat. The specific cavity or micro-cavity geometry as described herein provides for a greater surface area for radiation heat transfer exchange between a hot surface and a colder surface, which provides for greater heat absorption. For example, the radiant heat absorber as described herein can provide for twice the heat absorption as that of a flat, traditional heat absorber, or more. At the same time, the exterior surface formed resultant of the interior cavities forms natural fins, which provides for improved heat transfer at the upper, exterior surface.

Utilizing a phase change material such as the paraffin can provide for transferring the heat at a specific temperature. In addition to the phase change material, a coating or etching can be utilized to further improve or specifically tailor the heat absorption of the radiant heat absorber.

Furthermore, it is contemplated that the radiant heat absorber as described herein can be made by additive manufacturing, such as 3D printing, such as direct metal laser melting or direct metal laser sintering, as well as electroforming in non-limiting examples, while additional traditional methods of manufacture are contemplated; such as metal stamping.

The aspects of the present disclosure provide a heat-dissipating configuration for a heat producing component. The heat exchanger or heat-dissipating configuration can be configured to cool steady state heat loads or transient heat loads. The technical effect is that the aspects described herein enable the cooling of said heat producing component by way of absorbing at least a portion of heat generated at a first surface and dissipating the heat from an opposite second surface. One advantage that can be realized is superior cooling capabilities as compared with conventional systems by providing for increased heat absorption. In addition, this increase in efficiency can be appreciated while decreasing system weight, power, and improving specific fuel consumption.

Many other possible configurations in addition to that shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A radiant heat absorber comprising:
    a structure having a first and second surfaces, with the first surface defining a heat absorbing surface having a plurality of cavities and a heat absorbing coating applied to the first surface and residing within the plurality of cavities; and
    wherein at least some of the plurality of cavities include etchings on the heat absorbing surface.

2. The radiant heat absorber of claim 1 wherein the heat absorbing coating primarily absorbs heat within a first temperature range.

3. The radiant heat absorber of claim 2 wherein the first temperature range is between 50 and 100 degrees C.

4. The radiant heat absorber of claim 1 wherein the plurality of cavities have a volume ranging between 0.25 and 3.0 cubic centimeters.

5. The radiant heat absorber of claim 1 wherein the plurality of cavities have a surface area ranging between 0.25 and 1.5 square centimeters.

6. The radiant heat absorber of claim 1 wherein the plurality of cavities have at least one of the following shapes: pyramidal, hexagonal, or conical.

7. The radiant heat absorber of claim 6 wherein the plurality of cavities includes the pyramidal shape and the pyramidal shape is at least one of a 3-sided pyramid or a 4-sided pyramid.

8. The radiant heat absorber of claim 1 further comprising a phase change material in thermally conductive contact with the first surface.

9. The radiant heat absorber of claim 8 wherein the phase change material lies between the first and second surfaces.

10. The radiant heat absorber of claim 1 wherein at least the first surface of the structure is made of material having a high thermal conductivity.

11. The radiant heat absorber of claim 10 wherein the high thermal conductivity is greater than 200 Watt/meter-Kelvin.

12. A radiant heat absorber comprising:
    a structure having a first surface configured to face a heat-producing element and defining a heat absorbing surface, and a second surface opposite the first surface;
    wherein the first surface defines a plurality of cavities including one of a pyramidal shape, a hexagonal shape, or a conical shape and the second surface defines a plurality of protrusions complementary to the plurality of cavities.

13. The radiant heat absorber of claim 12 wherein the structure further includes a phase change material provided between the first surface and the second surface.

14. The radiant heat absorber of claim 13 wherein the structure further includes a compressible material provided between the first surface and the second surface, configured to compress in response to an expansion of the phase change material.

15. The radiant heat absorber of claim 13 wherein the phase change material is a paraffin.

16. The radiant heat absorber of claim 12 further comprising a heat absorbing coating on the first surface.

17. The radiant heat absorber of claim 12 further comprising micro-etches on the first surface.

18. A method of dissipating heat from a heat generating element, the method comprising:
    absorbing heat generated by the heat generating element with a radiant heat absorber including a first surface with a plurality of cavities having one of a pyramidal shape, a hexagonal shape, or a conical shape; and
    dissipating the heat absorbed by the radiant heat absorber at a second surface, opposite of the first surface, with a plurality of protrusions having the same one of the pyramidal shape, the hexagonal shape, or the conical shape of the plurality of cavities;
    wherein the dissipating includes convective heat transfer from the second surface.

19. The method of claim 18 further comprising treating the first surface with one of a heat absorbing coating or a set of micro-etches.

* * * * *